(12) United States Patent
Lee (10) Patent No.: US 9,282,659 B2
(45) Date of Patent: Mar. 8, 2016

(54) SNAP DOOR STRUCTURE FOR ELECTRONIC DEVICES

(71) Applicant: GETAC TECHNOLOGY CORPORATION, Hsinchu County (TW)

(72) Inventor: Kun-Cheng Lee, Taipei (TW)

(73) Assignee: Getac Technology Corporation, Hsinchu County (TW)

( * ) Notice: Subject to any disclaimer, the term of this patent is extended or adjusted under 35 U.S.C. 154(b) by 317 days.

(21) Appl. No.: 13/917,582

(22) Filed: Jun. 13, 2013

(65) Prior Publication Data
US 2014/0085784 A1  Mar. 27, 2014

(30) Foreign Application Priority Data

Sep. 27, 2012  (CN) .......................... 2012 1 0364854

(51) Int. Cl.
*H05K 5/00* (2006.01)
*H05K 5/02* (2006.01)
*G06F 1/16* (2006.01)

(52) U.S. Cl.
CPC ............ *H05K 5/0221* (2013.01); *G06F 1/1633* (2013.01); *H05K 5/0239* (2013.01)

(58) Field of Classification Search
CPC ... H05K 1/181; H05K 5/0017; H05K 5/0226; H05K 5/03; H05K 5/0217; H05K 7/1427; H05K 5/0021; H05K 5/0204; H05K 5/0221; H05K 5/04; H05K 7/14; H05K 7/1487; H05K 7/1488; H05K 5/0239; G06F 1/1601; G06F 1/1613; G06F 1/1616; G06F 1/1626; G06F 1/1637; G06F 1/1656; G06F 1/1658; G06F 1/1679; G06F 1/1684; G06F 1/165; G06F 1/1633

USPC ............ 361/679.01, 679.02, 679.09, 679.21, 361/679.27, 679.26, 724–727; 312/223.1–223.2
See application file for complete search history.

(56) References Cited

U.S. PATENT DOCUMENTS

| 7,789,437 | B2 * | 9/2010 | Sheng | 292/137 |
| 8,764,073 | B2 * | 7/2014 | Lin | 292/137 |
| 2009/0073644 | A1 * | 3/2009 | Yang | 361/679.4 |

FOREIGN PATENT DOCUMENTS

| CN | 102541161 A | 7/2012 |
| TW | 200847891 A | 12/2008 |

OTHER PUBLICATIONS

Taiwan Patent Office, Office Action, Patent Application No. 101136115, Mar. 30, 2015, Taiwan.

*Primary Examiner* — Anthony Haughton
*Assistant Examiner* — Ingrid Wright (57) ABSTRACT

The present invention discloses a snap door structure configured with an opening and a snap joint part. The snap door structure comprises a door cover, a switch puller and a stopper. The door cover is pivotally connected to the electronic device and installed in correspondence with the opening. The switch puller is connected to the door cover and slidable with respect thereto, in which the switch puller includes a clip joint segment and a snap connection part. The stopper is fixedly set to the door cover and clip latched between the door cover and the switch puller. The stopper has an elastic arm, in which the elastic arm along with the clip joint segment enable a multi-staged position adjustment function in order to cause the snap connection part to be correspondingly buckled to the snap joint part thus allowing coverage of the door cover on the opening.

10 Claims, 9 Drawing Sheets

SNAP DOOR STRUCTURE FOR ELECTRONIC DEVICES

BACKGROUND OF THE INVENTION

1. Field of the Invention

The present invention generally relates to a snap door structure using a cover board to shield an opening; in particular, it relates to a snap door structure for electronic devices.

2. Description of the Prior Art

Because of rapid development in computer technologies and hardware architecture thereof, notebook computers now become the mainstream in global markets. Meanwhile, to provide consumers with space for subsequent upgrades and equipment expansions, the manufacturers have developed certain types of devices allowing users to manually expand the hardware thereof. Generally, the housing of the aforementioned devices can be configured with an opening such that reserved space can be formed by the opening and the interior of the housing. The reserved space enables customized installations and utilizations by consumers, thus facilitating users in assembling and disassembling other peripheral hardware equipments.

On the other hand, to prevent dusts or other foreign objects from entering into the interior of the housing through the opening, the opening configured at the surface of the housing is usually installed with a door cover so as to open or close the opening for the purpose of protection. For example, US patent application publication number 20120144749, discloses a type of shield door cover which is applicable for notebook computers and can be fixedly clipped onto the housing. With this, it is possible to assure that the door cover may not be unexpectedly opened under harsh conditions in application environments, such as strong vibrations, accidental impacts or the like, and to offer desirable effects of convenient operations, dust-proof and water-proof.

However, the aforementioned US patent application publication number 20120144749, do exhibits certain following drawbacks: first, greater number of constituent components thereof may accordingly lead to more gaps between such components, resulting in poorer dust-proof and water-proof effects, as well as complicated assembly processes and increased manufacture costs. Second, a structure for preventing accidentally opening the door cover is lacked, so, in case of erroneous touches, vibrations or impacts, the door cover may be opened thus exposing the opening, and the intended protection and water-proof effects may fail.

Regarding to the above-said issues, the inventors of the present invention have devoted efforts on comprehensive researches about currently available technologies, in conjunction with theoretical applications, so as to resolve and eliminate existing problems thereby achieving the objectives of the present invention as set forth hereunder.

SUMMARY OF THE INVENTION

An objective of the present invention is to provide a snap door structure for electronic devices, in which a stopper is clip latched between a door cover and a switch puller and, through a stopper, the multi-staged position adjustment can be performed by the door cover along with the switch puller. In addition to convenient open/close operations and complete protection effects, the snap door structure according to the present invention further enables advantages of constituent component simplification, handy assembly processes as well as reduced manufacture costs.

To achieve the aforementioned objectives, the present invention provides a snap door structure for electronic devices, in which the electronic device is configured with an opening and a snap joint part, and the snap door structure comprises: a door cover, pivotally connected to the electronic device and installed in correspondence with the opening; a switch puller, connected to the door cover and slidable with respect thereto, in which the switch puller includes a clip joint segment and a snap connection part; and a stopper, fixedly placed to the door cover and clip latched between the door cover and the switch puller, in which the stopper includes an elastic arm such that the elastic arm along with the clip joint segment enables a multi-staged position adjustment function thereby causing the snap connection part to be correspondingly buckled to the snap joint part thus allowing the coverage of the door cover on the opening.

The present invention further provides the following effects:

First, the stopper is fixedly placed on the door cover and clip latched between the door cover and the switch puller such that, through the stopper, the door cover enables the multi-staged position adjustment in combination with the switch puller. In this way, the snap door structure according to the present invention enables convenient door cover open/close operations and fixed coverage of the door cover on the opening with simple components. So the features regarding to electronic device protection, handy assembly processes and reduced manufacture costs can be achieved.

Second, the door cover and the switch puller can be made of the same metallic material. The stopper and the lock snap can be made of plastic materials, or otherwise can be fabricated with the same metallic material as the door cover and the switch puller. In this way, the electric potential difference between different metallic materials can be effectively eliminated, such that hindered or unsmooth slide actions of the switch puller due to corrosion problem may not occur in the snap door structure according to the present invention. As such, the snap door structure according to the present invention has good structural durability.

Third, two opposite bumps extend out from the door cover to form a rail. Also, each of the two sides on the switch puller is configured with a U-shaped block, respectively, such that these two U-shaped blocks can be correspondingly joggled with the two bumps in engagement and slide. In this way, slide actions of the door cover and the switch puller can be successfully created by using such a structural recess/protrusion match. Thus, the switch puller operates more smoothly.

Fourth, a recess is configured on the door cover. The stopper is placed in correspondence with the recess so as to be joggled into the door cover, thus the stopper can be stably set in fixation onto the door cover. The stopper has an auxiliary elastic arm. The switch puller is configured with a clip notch, and the auxiliary elastic arm can be clip latched to the clip notch. As such, when the switch puller slides relatively to the door cover, the auxiliary elastic arm and the switch puller can be mutually clip latched by means of the clip notch to prevent undesirable detachment of the switch puller from the door cover, thereby improving the structural stability and strength of the snap door structure according to the present invention.

Fifth, the snap door structure according to the present invention further includes a lock snap. The lock snap allows choices of locking or releasing the switch puller in order to restrict the relative slide action between the switch puller and the door cover thereby allowing a protective mechanism against erroneously opening the snap door structure. In this way, upon occurrence of erroneous touches, vibrations or impacts, the switch puller remains locked so as to prevent undesirable slide actions. As such, the door cover can firmly shield the opening thus providing excellent protection effect to the electronic device.

Sixth, a protrusion part extends out from the elastic arm. The switch puller is configured with each positioning notch in order to form a clip joint segment such that the protrusion part is allowed to select a positioning notch to be clip latched. Hence, when the elastic arm is relatively positioned into each positioning notch, the elastic arm along with the positioning notch can create the multi-staged open/close perception in user's hand and the blockage effect, and the elastic arm and the positioning notch can hit each other to generate the click sound. So the user can actually perceive the clear positioning signal, thereby further enhancing the strength upon buckling the snap door structure.

Seventh, the coverage surface on the door cover for shielding the opening can be installed with a water-blocking cushion having identical size as the size of the opening so that the door cover can press against the water-blocking cushion to closely seal the opening. With such a cooperative sealing to the opening by the door cover and the water-blocking cushion, the door cover and the water-blocking cushion can provide the effects of water-proof, dust-proof or the like. Thus the snap door structure according to the present invention allows better protection to the electronic device.

DETAILED DESCRIPTION OF THE EMBODIMENTS

Detailed descriptions and technical contents of the present invention will now be set forth as below in conjunction with the drawings. However, the appended drawings are simply illustrative rather than being intended to limit the scope of the present invention.

Refer first to FIGS. 1 to 6. FIGS. 1 to 6 shows a snap door structure for electronic devices according to the present invention. The electronic device 100 is configured with an opening 101 and a snap joint part 102. The snap door structure 10 as illustrated comprises a door cover 1, a switch puller 2 and a stopper 3.

The door cover 1 is pivotally connected to the electronic device 100 and disposed in correspondence with the opening 101. Also, the door cover 1 is configured with an accommodation area 11 and a rail 111 is formed in correspondence with the accommodation area 11. Specifically, the door cover 1 has two sidewalls 112 formed on two sides of the accommodation area 11. Two opposite bumps 113 extend out from the two sidewalls 112 thereby forming the rail 111. In addition, the door cover 1 has a bottom wall 114 formed at the bottom of the accommodation area 11. The bottom wall 114 is configured with a joggle segment 115, in which the joggle segment 115 comprises a recess 1151 formed on the bottom wall 114, a first clip edge 1152 formed at the peripheral edge of the joggle segment 115 facing the recess 1151, and a second clip edge 1153 formed at the other end. Besides, the bottom wall 114 is configured with a through hole 116 and two orifices 117.

The switch puller 2 is connected to the door cover 1 and slides with respect thereto. The switch puller 2 includes a clip joint segment 21 and a snap connection part 22. Specifically, each of the two sides on the switch puller 2 is configured with a U-shaped block 23, such that these two U-shaped blocks 23 can be correspondingly joggled with the two bumps 113 in engagement and slide. That is, the switch puller 2 is allowed to slide in the accommodation area 11 by way of the rail 111. Moreover, the switch puller 2 is configured with a plurality of positioning notches 211 which form a clip joint segment 21. The snap connection part 22 and the snap joint part 102 indicate a combination of protrusion and recess so as to achieve the mutual snap joint feature. Beside, the switch puller 2 has two clip notches 24.

The stopper 3 is fixedly set to the door cover 1 and clip latched between the door cover 1 and the switch puller 2. The stopper 3 has an elastic arm 31, in which the elastic arm 31 along with the clip joint segment 21 enable a multi-staged position adjustment function in order to cause the snap connection part 22 to be correspondingly buckled to the snap joint part 102 thus allowing coverage of the door cover 1 on the opening 101.

Specifically, the stopper 3 is located at the joggle segment 115 and joggled into the bottom wall 114 in correspondence with the recess 1151. Herein a protrusion 32 extends out from the upper edge of the stopper 3. The outer peripheral edge of the stopper 3 is correspondingly clip jointed to the first clip edge 1152, while the protrusion 32 is correspondingly clip jointed to the second clip edge 1153. Moreover, a protrusion part 311 extends out from the elastic arm 31 and selects one of the positioning notches 211 for clip latching. Also, the stopper 3 includes two auxiliary elastic arms 33. Such two auxiliary elastic arms 33 are configured on two sides of the elastic arm 31 and clip latched to the two clip notches 24. Herein the elastic arm 31 is configured in correspondence with the through hole 116. Meanwhile, each of the auxiliary elastic arms 33 is configured in correspondence with each of the orifices 117. In this way, the elastic arm 31 as well as the auxiliary elastic arms 33 can perform elastic swing motions inside the through hole 116 and the orifices 117.

The snap door structure 10 according to the present invention further includes a lock snap 4. An accommodation cavity 5 for accommodating the lock snap 4 is formed between the door cover 1 and the switch puller 2. In addition, the switch puller 2 is configured with a hollow area 25 connected in communication with the accommodation cavity 5 and a first clip latch part 26 extending out toward the interior of the hollow area 25. Herein the lock snap 4 is exposed to the hollow area 25 and a second clip latch part 41 extends out therefrom. The lock snap 4 can be moved through the hollow area 25. Hence, the first clip latch part 26 and the second clip latch part 41 are allowed to be mutually clip latched in position.

Besides, the door cover 1 and the switch puller 2 can be made of the same metallic material. The stopper 3 and the lock snap 4 can be made of plastic materials, or otherwise can be fabricated with the same metallic material as the door cover 1 and the switch puller 2.

The assembly of the snap door structure 10 according to the present invention exploits the configuration consisting of the door cover 1 pivotally connected to the electronic device 100 and the corresponding opening 101. The switch puller 2 is connected to the door cover 1 and slidable with respect thereto, in which the switch puller 2 includes a clip joint segment 21 and a snap connection part 22. The stopper 3 is fixedly set to the door cover 1 and clip latched between the door cover 1 and the switch puller 2. The stopper 3 has an elastic arm 31, in which the elastic arm 31 along with the clip joint segment 21 enable a multi-staged position adjustment function in order to cause the snap connection part 22 to be correspondingly buckled to the snap joint part 102 thus allowing coverage of the door cover 1 on the opening 101. As such, the stopper 3 can be fixedly set to the door cover 1 and clip latched between the door cover 1 and the switch puller 2. So the door cover 1 along with the switch puller 2 can perform the multi-staged position adjustment by means of the stopper 3. As such, the snap door structure 10 according to the present invention is capable of enabling functions of conveniently opening the door cover 1 and stably fixing the coverage of the door cover 1 on the opening 101 with simple components, thereby further achieving the objectives of protection to the electronic device 100, handy assembly processes and reduced manufacture costs.

Figure 1:
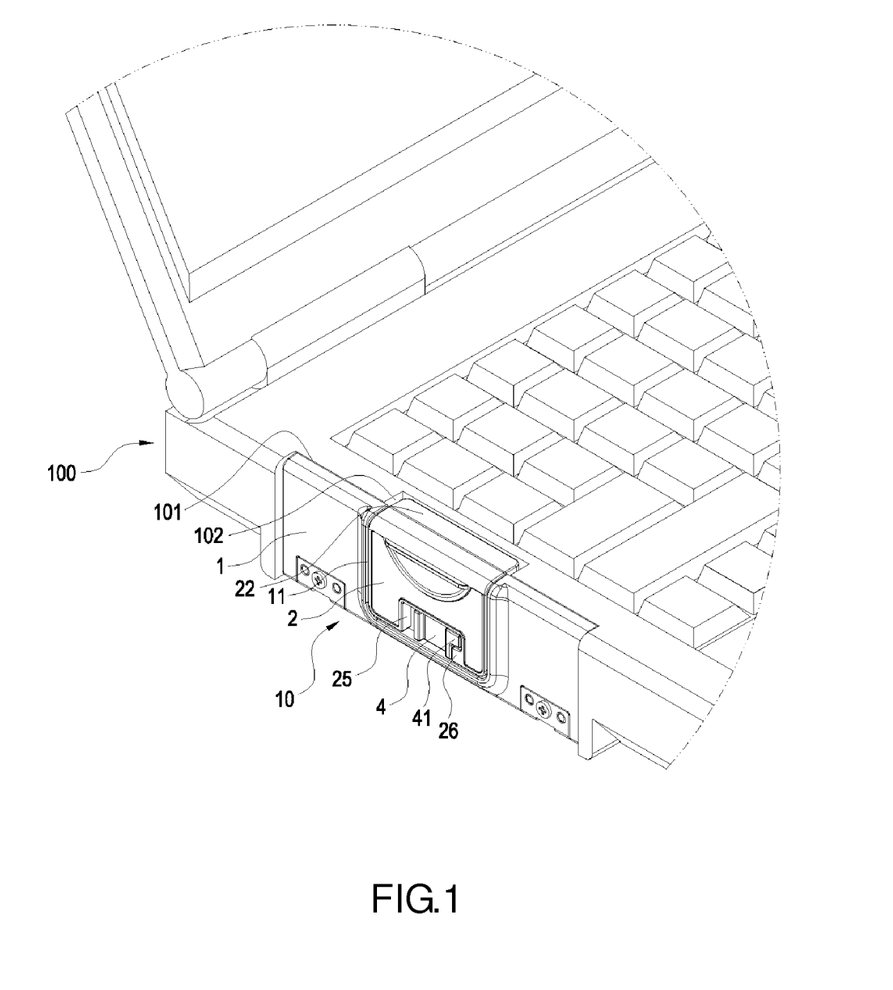
FIG. 1 shows an assembly perspective view of the snap door structure according to the present invention.
Figure 2:
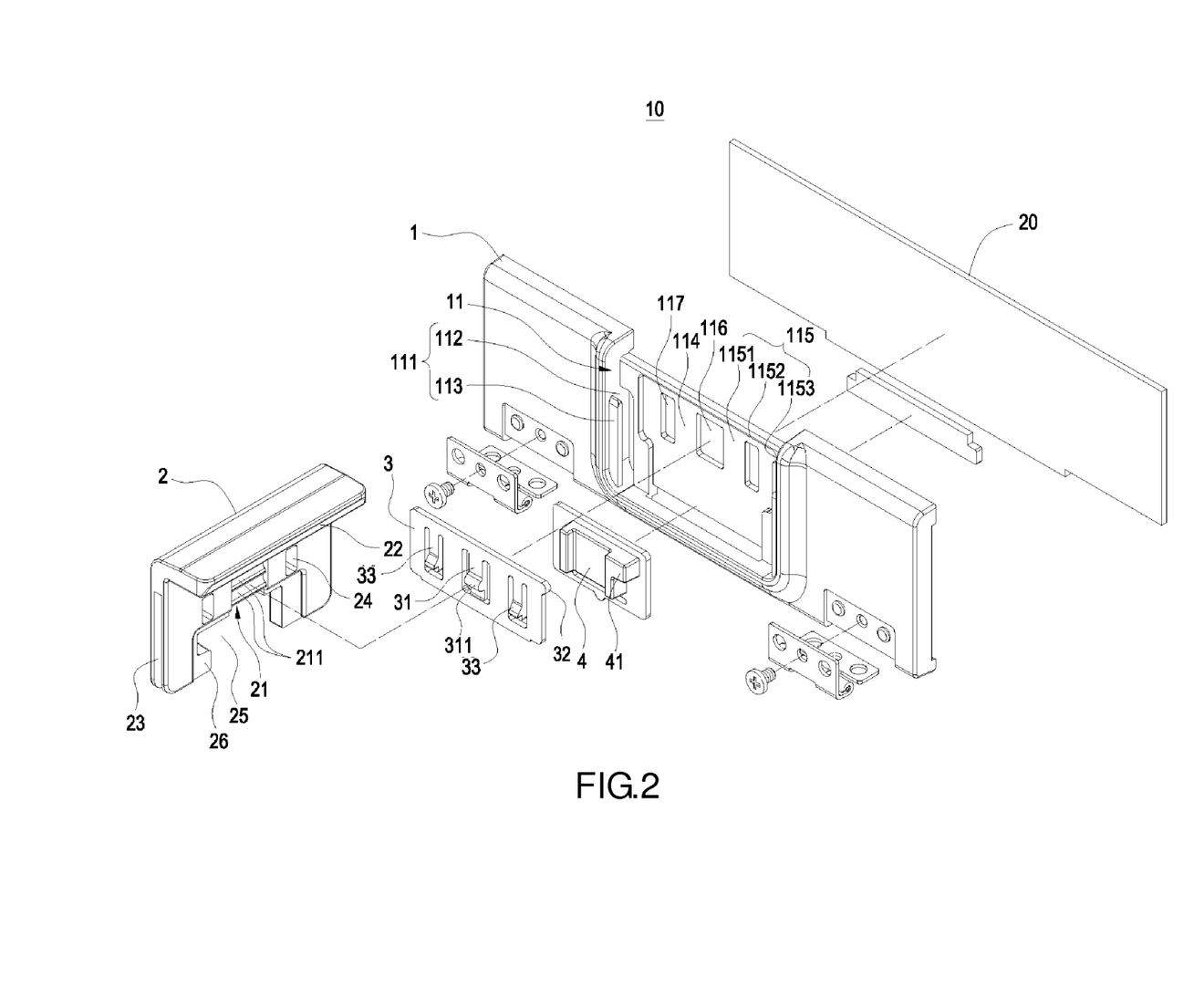
FIG. 2 shows an exploded perspective view of the snap door structure according to the present invention.

Analogously, refer next to FIG. 2, indicating that the stopper 3 can be reversely disposed in fixation on the switch puller 2 as well. Here the door cover 1 is configured with a plurality of recesses similar to the structure of the clip joint segment 21. Through the multi-staged position adjustment enabled by the elastic arm 31 and each of the recesses, it is possible to buckle the snap connection part 22 in correspondence with the snap joint part 102. Consequently, the door cover 1 covers the opening 101 such that the switch puller 2 along with the door cover 1 can perform multi-staged position adjustment operations through the stopper 3. As a result, the aforementioned functions and features can be equivalently achieved.

Besides, the door cover 1 and the switch puller 2 are made of the same metallic material. The stopper 3 and the lock snap 4 can be made of plastic materials, or otherwise can be fabricated with the same metallic material as the door cover 1 and the switch puller 2. In this way, the electric potential difference between different metallic materials can be effectively eliminated. So the occurrence of corrosion in the door cover 1, the switch puller 2, the stopper 3 or the lock snap 4 and the like can be prevented. In turn, hindered or unsmooth slide actions of the switch puller 2 due to corrosion problem may not happen to the snap door structure 10 according to the present invention. As such, the snap door structure 10 according to the present invention provides good structural durability.

Figure 4:
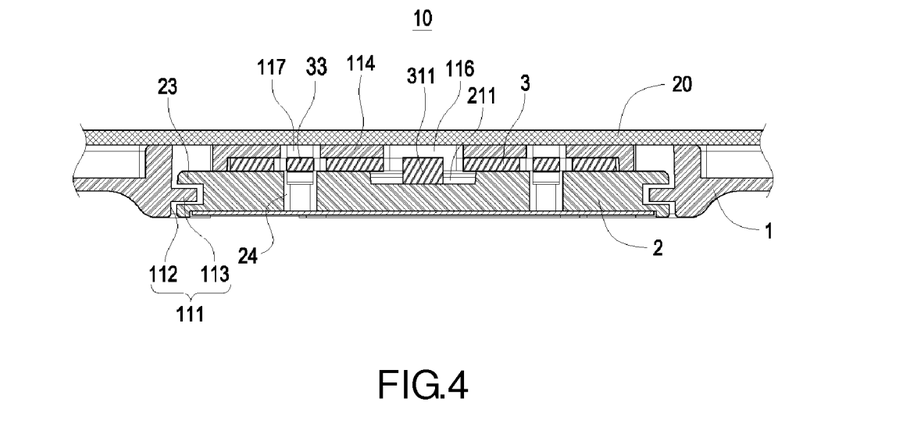
FIG. 4 shows an assembly schematic view of the snap door structure according to the present invention.
Figure 5:
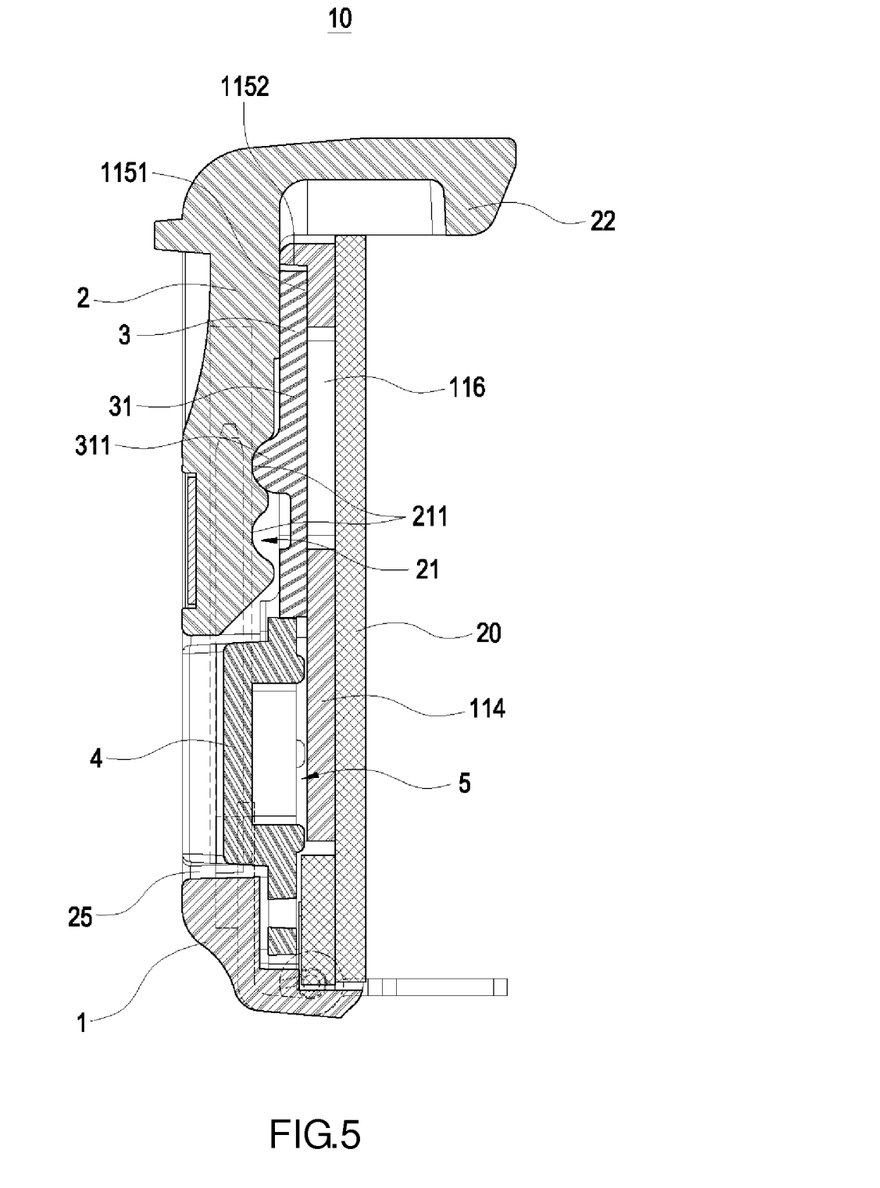
FIG. 5 shows another assembly schematic view of the snap door structure according to the present invention.
Figure 6:
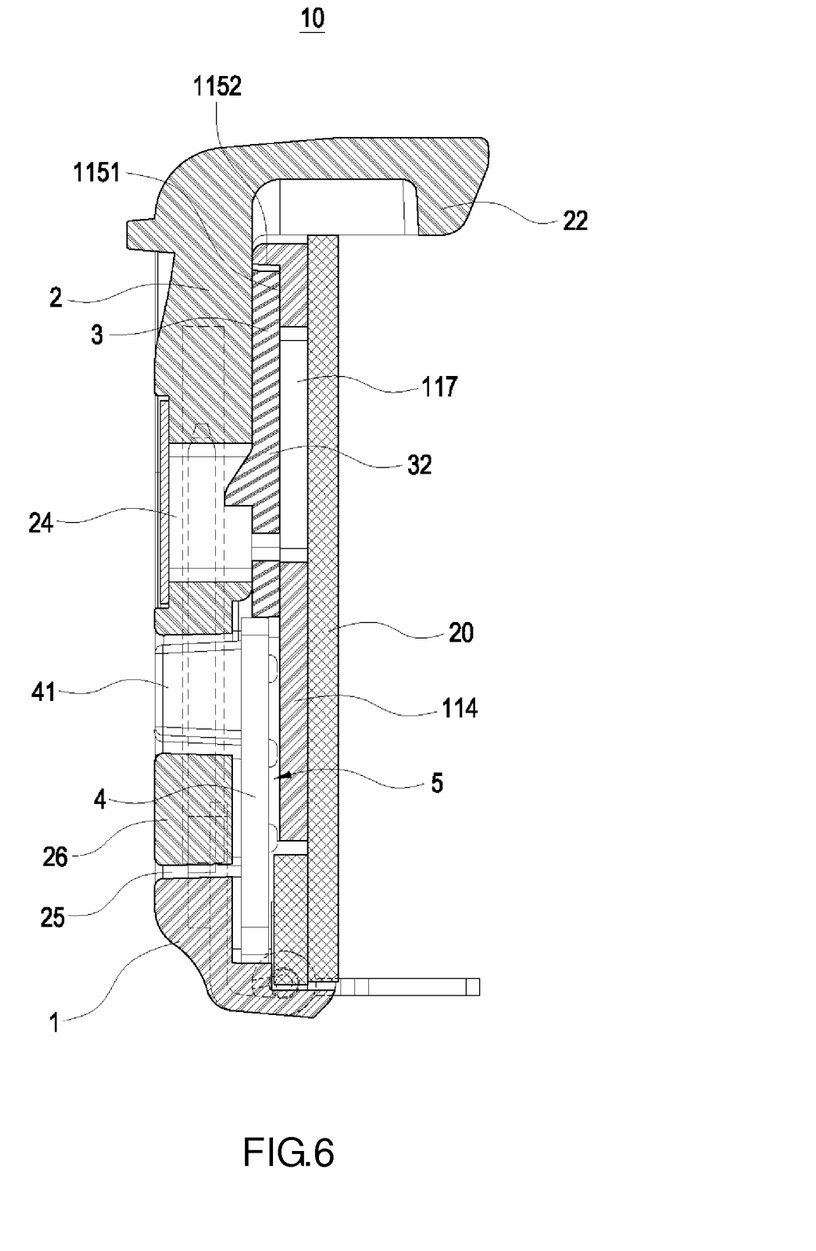
FIG. 6 shows yet another assembly schematic view of the snap door structure according to the present invention.

Furthermore, as shown in FIG. 4, two opposite bumps 113 extend out from the door cover 1 to form a rail 111. Also, each of the two sides on the switch puller 2 is configured with a U-shaped block 23, respectively, such that these two U-shaped blocks 23 can be correspondingly joggled with the two bumps 113 in engagement and slide. In this way, the convenience of slide operations of the door cover 1 and the switch puller 2 can be elevated by using such a structural recess/protrusion match. Therefore, perceptions on the smooth slide actions of the switch puller 2 can be further enhanced.

In addition, the door cover 1 is configured with the recess 1151. The stopper 3 is joggled into to the door cover 1 in correspondence with the recess 1151. So the stopper 3 can be stably fixed onto the door cover 1. Also, the stopper 3 includes the auxiliary elastic arm 33. The switch puller 2 is configured with the clip notch 24, and the auxiliary elastic arm 33 can be clip latched to the clip notch 24. Therefore, when the switch puller 2 slides relatively to the door cover 1, the auxiliary elastic arm 33 and the switch puller 2 can be mutually clip latched by way of the clip notch 24 in order to avoid unwanted detachment of the switch puller 2 from the door cover 1. Thus the structural stability and strength of the snap door structure 10 according to the present invention can be elevated.

Figure 3:
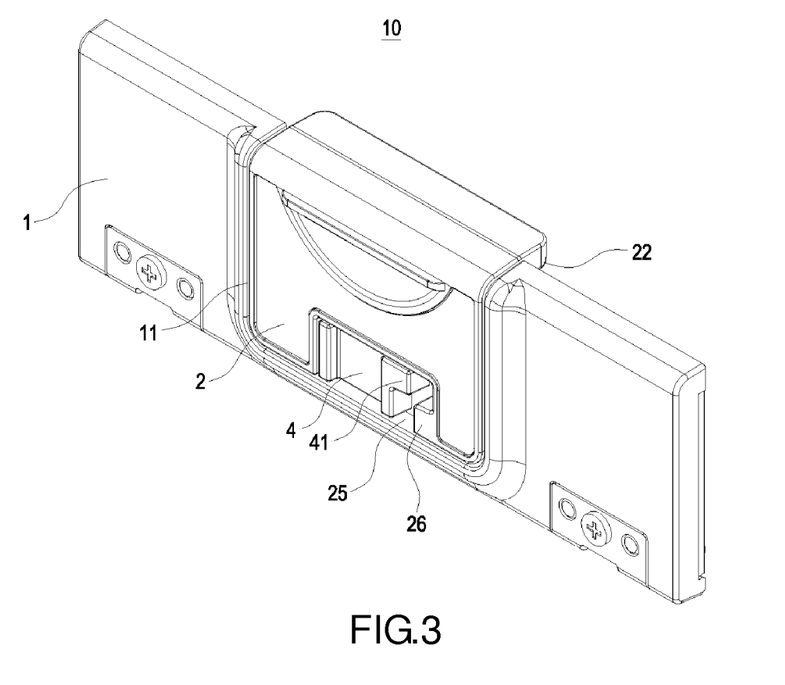
FIG. 3 shows another assembly perspective view of the snap door structure according to the present invention.

Besides, as shown in FIG. 3, the snap door structure 10 according to the present invention further comprises a lock snap 4. The lock snap 4 is installed between the door cover 1 and the switch puller 2 and exposed to a hollow area 25 configured in the switch puller 2. Herein a first clip latch part 26 extends out from the switch puller 2 toward the interior of the hollow area 25. Meanwhile, a second clip latch part 41 also extends out from the lock snap 4. Through the hollow area 25, the lock snap 4 can be moved such that the first clip latch part 26 and the second clip latch part 41 can be mutually clip latched in position. Doing so, it is possible to select the lock snap 4 to hold or release the switch puller 2 in order to restrict the relative slide movement of the switch puller 2 and the door cover 1. This may act as a protective mechanism for preventing the snap door structure 10 from opening up due to erroneously touches. Therefore, even in case of erroneous touches, vibrations or impacts, the switch puller 2 remains fixed by the lock snap 4 so as to avoid undesirable slide actions. As such, the door cover 1 can firmly shield the opening 101 thus providing excellent protection effect to the electronic device 100.

Refer next to FIGS. 7 to 10, wherein application states of the snap door structure according to the present invention are shown. The stopper 3 is clip latched between the door cover 1 and the switch puller 2. Herein the stopper 3 has an elastic arm 31, and the elastic arm 31 along with the clip joint segment 21 enable a multi-staged position adjustment function in order to cause the snap connection part 22 to be correspondingly buckled to the snap joint part 102 thus allowing coverage of the door cover 1 on the opening 101. Herein a protrusion part 311 extends out from the elastic arm 31. The switch puller 2 is configured with the positioning notches 211 in order to form a clip joint segment 21 such that the protrusion part 311 is allowed to select one of the positioning notches 211 to be clip latched.

Figure 7:
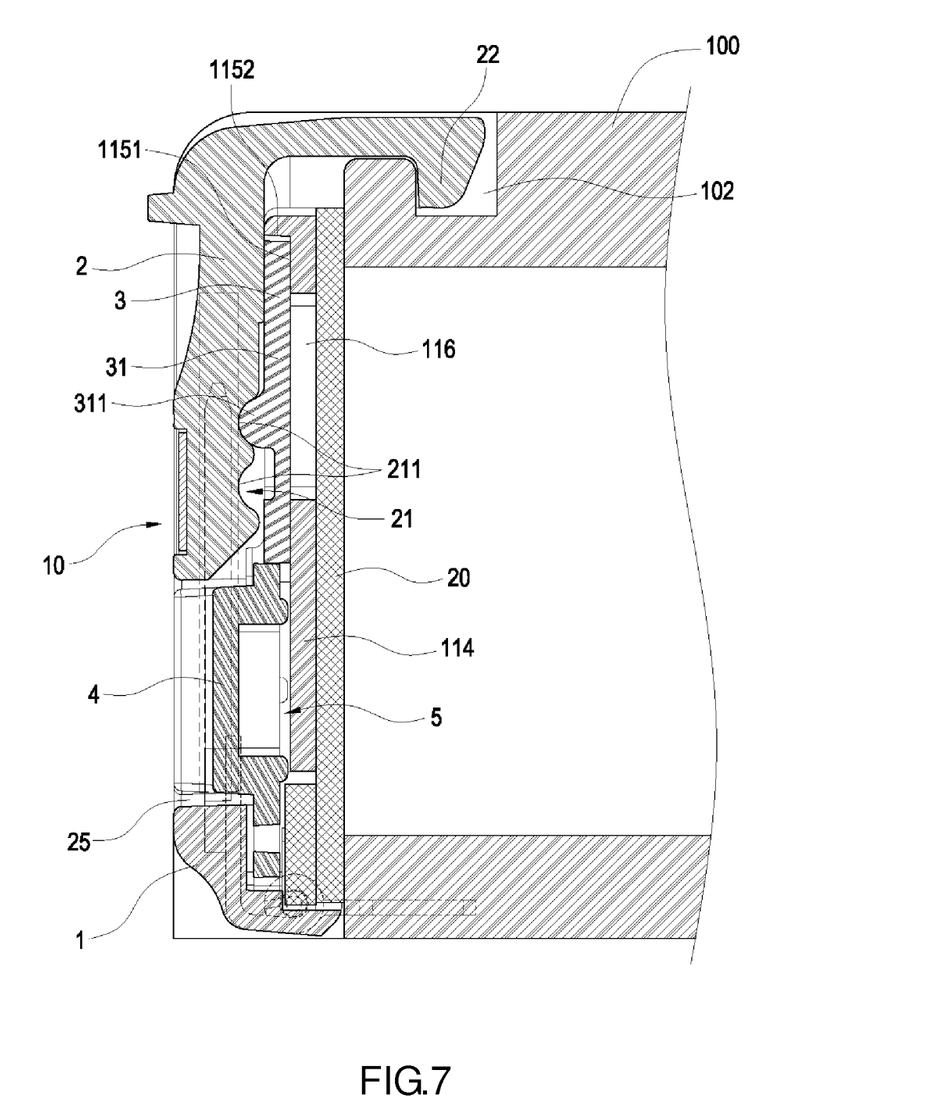
FIG. 7 shows an application state schematic view of the snap door structure according to the present invention.

Initially, as shown in FIG. 7, when sliding the switch puller 2 downward (see the direction pointed by the arrowhead), the protrusion part 311 will latch an upper positioning notch 211. Thus, the switch puller 2 can pull the snap connection part 22 to be snap jointed in correspondence with the snap joint part 102. Hence, the snap door structure 10 can firmly cover the opening 101.

Figure 8:
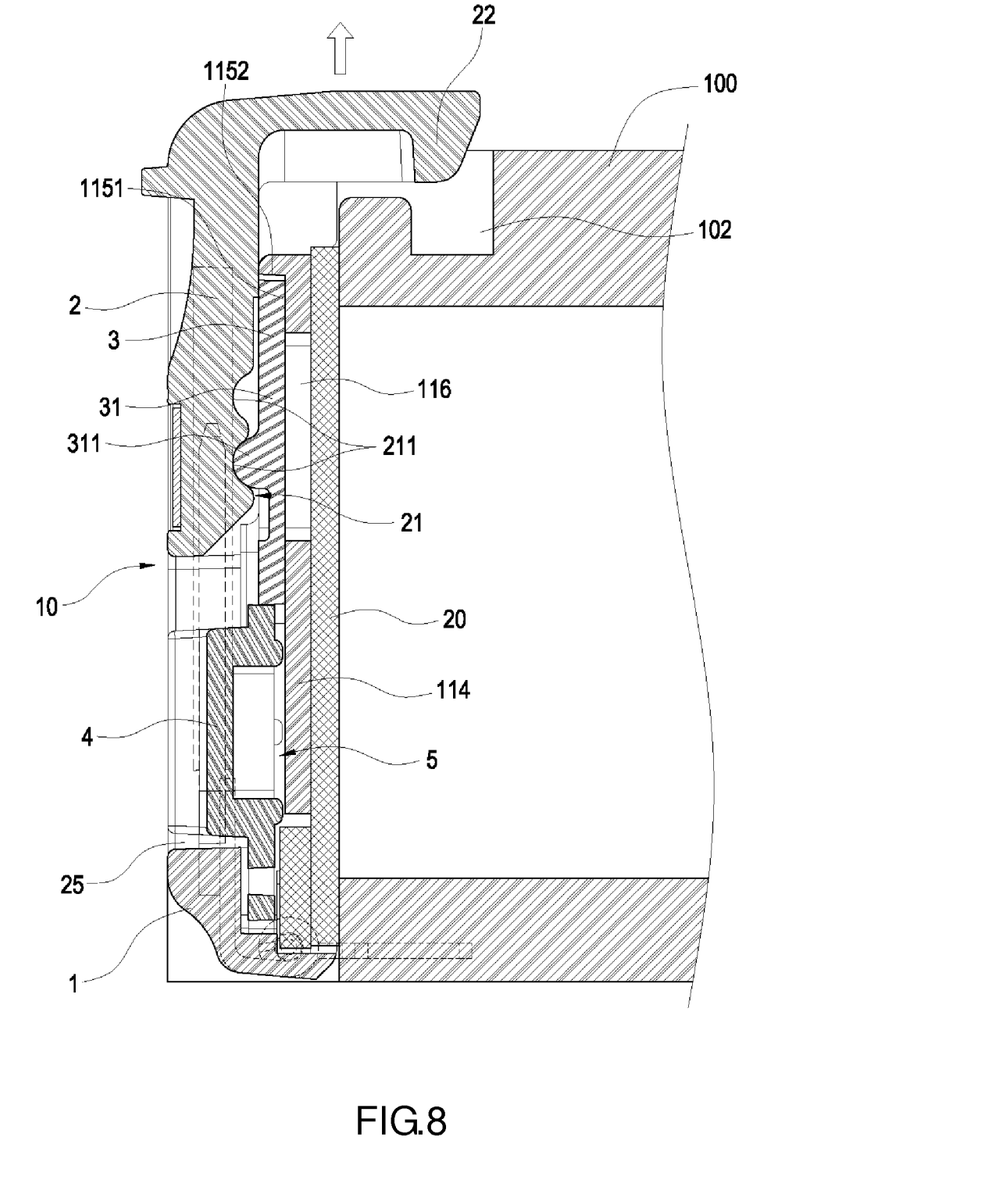
FIG. 8 shows another application state schematic view of the snap door structure according to the present invention.
Figure 9:
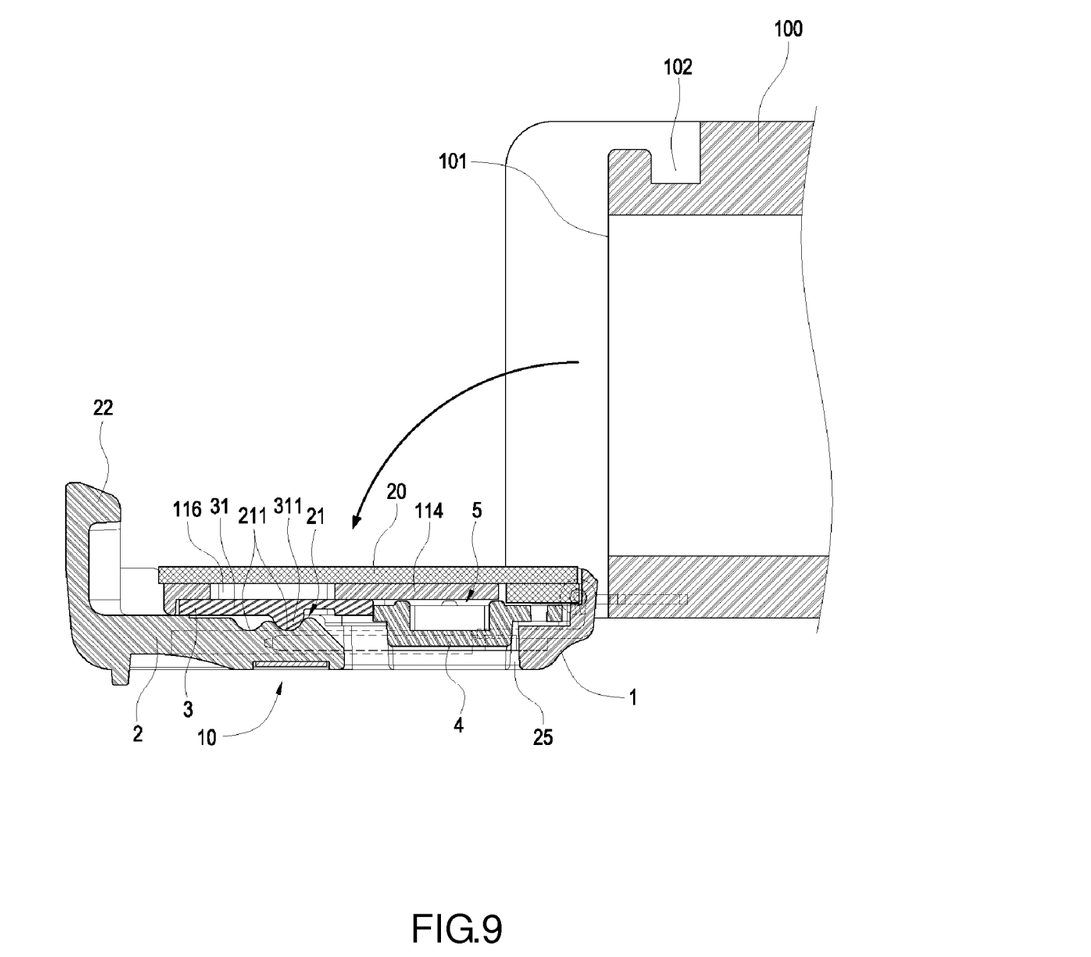
FIG. 9 shows yet another application state schematic view of the snap door structure according to the present invention.
Figure 10:
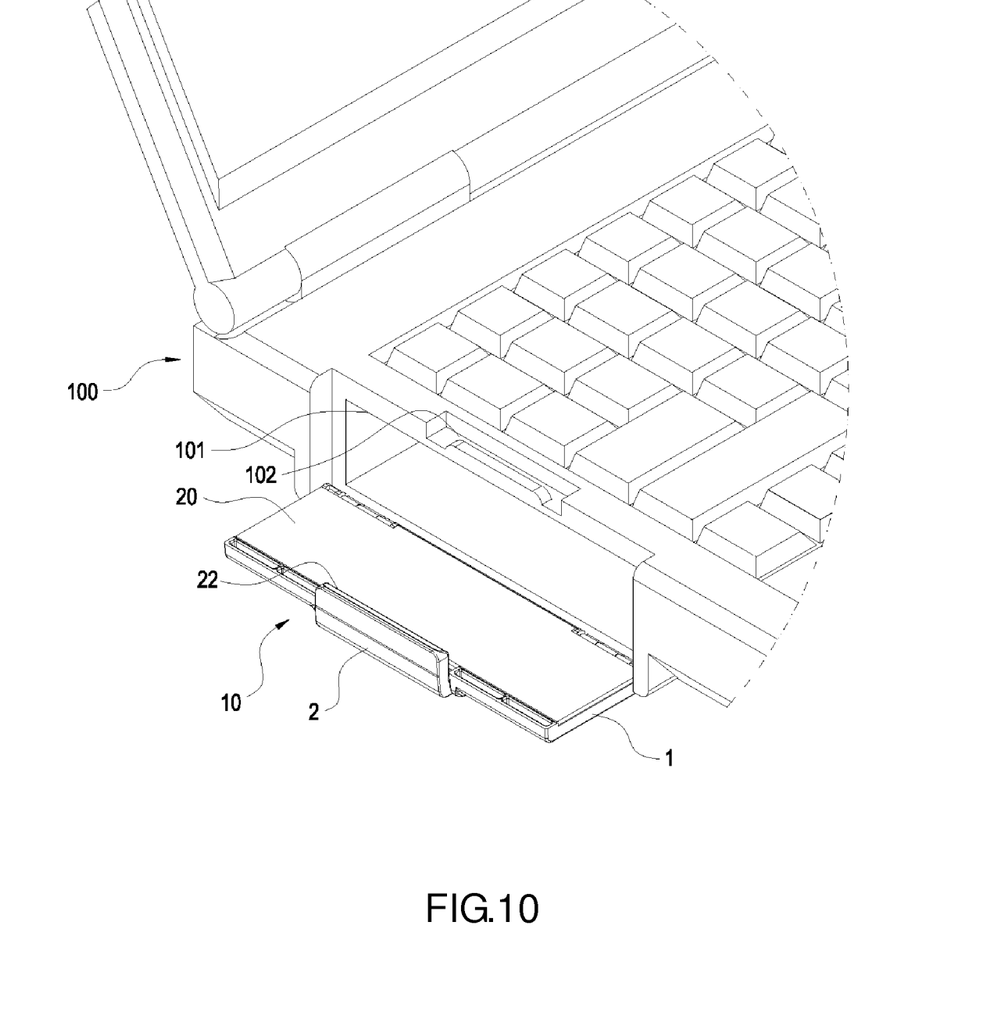
FIG. 10 shows still another application state schematic view of the snap door structure according to the present invention.

Furthermore, as shown in FIGS. 8 to 10, now sliding the switch puller 2 upward (see the direction pointed by the arrowhead in FIG. 8). The protrusion part 311 is selected to be clip latched to a lower positioning notch 211. In this way, the switch puller 2 can cause the snap connection part 22 to disengage from the corresponding snap joint part 102 such that the snap door structure 10 exposes the opening 101.

Through this, the protrusion part 311 extends out from the elastic arm 31. The switch puller 2 is configured with the positioning notches 211 in order to form a clip joint segment 21 such that the protrusion part 311 is allowed to select one of the positioning notches 211 to be clip latched. As such, in case that the elastic arm 31 is relatively positioned into each positioning notch 211, the elastic arm 31 along with the positioning notch 211 can create the multi-staged open/close perception in user's hand and the blockage effect. Besides, the elastic arm 31 and the positioning notch 211 can hit each other to generate the click sound, allowing the user actually perceive the clear positioning signal. Accordingly, the strength upon buckling the snap door structure 10 can be further enhanced.

What is more, the coverage surface on the door cover 1 for shielding the opening 101 can be installed with a water-blocking cushion 20 having identical size as the size of the opening 101 in size. So the door cover 1 can press against the water-blocking cushion 20 in order to closely seal the opening 101. With such a cooperative sealing to the opening 101 by the door cover 1 and the water-blocking cushion 20, the door cover and the water-blocking cushion can provide useful effects like water-proof, dust-proof or the like. Consequently, the snap door structure 10 according to the present invention allows better protection to the electronic device. In summary, no other products similar to the snap door structure for electronic devices according to the present invention as previously illustrated have been released, nor publicly utilized. In addition, the snap door structure for electronic devices according to the present invention features industrial utilization, innovation and advancement, which completely fulfills requirements regarding to patent applications. In view of above, the present application has novelty and an inventive step, and meets the requirements in Patent Law for patent examination. Therefore, allowance of the present application is politely requested.

What is claimed is:

1. A snap door structure for electronic devices, in which the electronic device is configured with an opening and a snap joint part, and the snap door structure comprises:
    a door cover, pivotally connected to the electronic device and installed in correspondence with the opening;
    a switch puller, connected to the door cover and slidable with respect thereto, in which the switch puller includes a clip joint segment and a snap connection part; and
    a stopper, fixedly placed to the door cover and clip latched between the door cover and the switch puller, in which the stopper includes an elastic arm such that the elastic arm along with the clip joint segment enable a multi-staged position adjustment function thereby causing the snap connection part to be correspondingly buckled to the snap joint part thus allowing the coverage of the door cover on the opening;
    wherein the door cover is configured with an accommodation area and two sidewalls formed on two sides of the accommodation area, two opposite bumps extend from the two sidewalls and conjunctively form a rail, the two sides of the switch puller have two U-shaped blocks arranged such that the two U-shaped blocks are correspondingly joggled with the two bumps in engagement and slide, so the switch puller is slidable in the accommodation area by way of the rails.

2. The snap door structure for electronic devices according to claim 1, wherein the door cover has a bottom wall formed at the bottom of the accommodation area, the bottom wall is configured with a joggle segment, the stopper is locate in the joggle segment and a through hole in correspondence with the elastic arm is configured at the bottom wall.

3. The snap door structure for electronic devices according to claim 2, wherein the a protrusion extends out from the upper edge of the stopper, the joggle segment is a recess formed at the bottom wall, a first clip edge is formed at the peripheral edge thereof facing the recess and a second clip edge is formed at the other end, in which the stopper is joggled into the bottom wall in correspondence with the recess, the outer peripheral edge of the stopper is clip jointed in correspondence with the first clip edge while the protrusion is clip jointed in correspondence with the second clip edge.

4. The snap door structure for electronic devices according to claim 1, wherein the switch puller is configured with a plurality of positioning notches which form the clip joint segment, and a protrusion part extends out from the elastic arm and selects one of the positioning notches for clip latch.

5. The snap door structure for electronic devices according to claim 1, wherein the stopper has two auxiliary elastic arms which are configured on two sides of the elastic arm, the switch puller is installed with two clip notches such that the two auxiliary elastic arms are clip latched to the two clip notches, and the bottom wall is configured with two orifices in correspondence with the two auxiliary elastic arms.

6. The snap door structure for electronic devices according to claim 1, further comprising a lock snap, wherein an accommodation cavity for receiving the lock snap is formed between the door cover and the switch puller, the switch puller is configured with a hollow area connected in communication to the accommodation cavity and a first clip latch part extending toward the hollow area, and a second clip latch part protrudes from the lock snap, in which the lock snap is exposed to the hollow area and moves via the hollow area such that the first clip latch part and the second clip latch part can be mutually clip latched in position.

7. The snap door structure for electronic devices according to claim 6, wherein the door cover and the switch puller are made of the same metallic material, and the lock snap is made of plastic materials.

8. The snap door structure for electronic devices according to claim 6, wherein the door cover, the switch puller and the lock snap are made of the same metallic material.

9. The snap door structure for electronic devices according to claim 1, wherein the door cover and the switch puller are made of the same metallic material, and the stopper is made of plastic materials.

10. The snap door structure for electronic devices according to claim 1, wherein the door cover, the switch puller and the stopper are made of the same metallic material.

* * * * *